United States Patent [19]

Ueno et al.

[11] Patent Number: 5,239,614
[45] Date of Patent: Aug. 24, 1993

[54] SUBSTRATE HEATING METHOD UTILIZING HEATING ELEMENT CONTROL TO ACHIEVE HORIZONTAL TEMPERATURE GRADIENT

[75] Inventors: Seiko Ueno, Mizusawa; Ken Nakao, Sagamihara; Kikuo Yamabe, Yokohama; Keitaro Imai, Kawasaki, all of Japan

[73] Assignees: Tokyo Electron Sagami Limited, Kanagawa; Kabushiki Kaisha Toshiba, Kawasaki, both of Japan

[21] Appl. No.: 791,545

[22] Filed: Nov. 14, 1991

[30] Foreign Application Priority Data

Nov. 14, 1990 [JP] Japan .................. 2-308271

[51] Int. Cl.⁵ .............. H01L 21/205; H01L 21/22
[52] U.S. Cl. .................. 392/416; 118/725; 118/730; 219/390
[58] Field of Search ........... 392/416, 418, 388-389; 219/405, 411, 385, 390; 118/730, 641-643, 724-725, 50.1; 427/55

[56] References Cited

U.S. PATENT DOCUMENTS

| | | | |
|---|---|---|---|
| 3,140,965 | 7/1964 | Reuschel | 437/103 |
| 4,062,318 | 12/1977 | Ban et al. | 118/730 |
| 4,306,515 | 12/1981 | Winkler | 118/724 |
| 4,609,343 | 9/1986 | Tejfalussy | 432/36 |
| 4,680,451 | 7/1987 | Gat et al. | 118/725 |
| 4,745,088 | 5/1988 | Inoue et al. | 118/730 |
| 4,789,771 | 12/1988 | Robinson et al. | 118/730 |
| 4,823,735 | 4/1989 | Pichel et al. | 118/730 |
| 4,886,954 | 12/1989 | Yu et al. | 219/390 |
| 4,926,793 | 5/1990 | Arima et al. | 118/730 |
| 4,937,434 | 6/1990 | Nakao | 219/390 |
| 4,950,870 | 8/1990 | Mitsuhasi et al. | 219/390 |
| 4,954,684 | 9/1990 | Aoki et al. | 219/390 |
| 5,001,327 | 3/1991 | Hirasawa et al. | 219/390 |
| 5,070,815 | 12/1991 | Kasai et al. | 118/725 |

FOREIGN PATENT DOCUMENTS

| | | | |
|---|---|---|---|
| 48-8657 | 3/1973 | Japan . | |
| 63-226921 | 9/1988 | Japan | 118/724 |
| 63-278227 | 11/1988 | Japan . | |

Primary Examiner—Bruce A. Reynolds
Assistant Examiner—John A. Jeffery
Attorney, Agent, or Firm—Oblon, Spivak, McClelland, Maier & Neustadt

[57] ABSTRACT

A heat-treating method comprising preparing a plurality of wafers parallel to one another in a process tube while keeping their surfaces to be treated substantially horizontal, arranging plural $MoSi_2$ wire heaters along the longitudinal axis of the process tube so as to be placed around the process tube, adjusting the amount of current supplied to the heaters to form on the treated surface of each of the wafers temperature gradient extending from one side of the outer circumferential rim of each of the wafers to the other side thereof, and rotating the wafers in their surfaces.

16 Claims, 7 Drawing Sheets

SUBSTRATE HEATING METHOD UTILIZING HEATING ELEMENT CONTROL TO ACHIEVE HORIZONTAL TEMPERATURE GRADIENT

BACKGROUND OF THE INVENTION

1. Field of the Invention

The present invention relates to a method of uniformly heat-treating wafers.

2. Description of the Related Art

The heat-treating apparatus is conventionally employed for use with various kinds of apparatus such as the CVD apparatus for forming thin film, the epitaxial growth apparatus and the oxide film forming apparatus or with the heat-diffusing unit of the doping apparatus in the course of manufacturing semiconductor wafers.

The heat-treating apparatus has been developed to have a heater whose inner sufficient diameter exceeds 300 mm so as to meet the trend of making diameters of semiconductor wafers larger and larger. As the diameter of the semiconductor wafer is made larger and larger, however, it becomes more difficult to control temperature in the process tube. This makes it necessary to often use the furnace of the vertical type because it is easier to control temperature on any of cross sections of the furnace.

A CVD furnace of this vertical type is disclosed in U.S. Pat. No. 4,938,691, for example. A process tube in the CVD furnace of the vertical type is provided at the bottom thereof with an opening through which a wafer boat is carried into and out of the process tube. 100–150 sheets of semiconductor wafers are mounted parallel to one another on the boat. A spiral heater made of resistant heating material such as FeCrAl alloy encloses the process tube and the wafers in the process tube are heated to a desired process temperature ranging from 700° C. to 1200° C. by this spiral heater. The spiral heater is enclosed by heat-insulating material so as to reduce the amount of heat radiated from the process tube (or amount of radiation heat).

In the conventional case, however the wafers on the boat are heated from outside, and the center portion of each wafer is more heated than the peripheral portion. Consequently, as is shown in FIG. 1, as the temperature in the furnace is raised from room temperature (line K) to a predetermined temperature (line P) slightly lower than a process temperature (line Q), the temperature difference between the center and peripheral portion of each wafer increases gradually. Thereafter, the temperature in the furnace is maintained at the process temperature (line Q), whereby said temperature difference decreases gradually to substantially nil.

In particular, when the wafers are heated by a heater of the type disclosed in Published Examined Japanese Patent Application No. 48-8657, which has $MoSi_2$ heating element, they are heated so fast that the temperature difference between the center and peripheral portions of each wafer is considerably great at the predetermined temperature (line P) which is a little lower than the process temperature (line Q). When such a temperature difference occurs, the thin film formed on the wafer has but a non-uniform thickness, ultimately degrading the quality of the semiconductor devices formed on the wafer.

This non-uniformity of temperature on each wafer surface results from how the wafers are positioned and held in the process tube in the furnace of the vertical type. In order to solve the non-uniformity of temperature on each wafer surface, therefore, it is desired to improve the process of manufacturing semiconductor devices.

The larger the diameter of each wafer, the more difficult it is to space the wafer away the heater by a long distance. If the heater is a type, in particular, the wafers are heated to different extents. Consequently, the semiconductor devices made from one wafer have quality different from that the devices made from another wafer.

SUMMARY OF THE INVENTION

An object of the present invention to provide a heat-treatment method capable of the non-uniformity of temperature on each wafer on each wafer surface in the case where semiconductor wafers are heated-treated in a furnace of the vertical type.

Another object of the invention is to provide a heat-treating method capable of heating semiconductor wafers to the same extent in a vertical-type furnace.

According to an aspect of the present invention, there can be provided a heat-treating method comprising preparing a plurality of substrates in a process tube in such a way that the substrates are made parallel to one another while keeping their surfaces to be treated substantially horizontal, arranging plural resistive heating elements along the longitudinal direction of the process tube so as to be placed around the process tube, rotating the substrates in a plane of the surface of the substrate. Furthermore, the method comprising adjusting the power supplied to the resistant heating elements, thereby forming in the treated surface of each substrate a temperature gradient which extends from one peripheral portion of the substrate to the opposite peripheral portion thereof, and rotating each substrate in a plane parallel to the treated surface of the substrate.

It is preferable that each of the resistive heating elements enclosing the process tube has a large surface load. It is also preferable that each of the resistive heating elements is arranged round the process tube, extending along the longitudinal direction thereof.

It is preferable in this case that current supply to some of the resistive heating elements is stopped or the amount of current supplied to some of the resistive heating elements is so reduced as to heat objects to be treated in such a way that each of them has temperature gradient in the diameter, direction thereof.

When the objects each having this temperature gradient are rotated in the process tube, the amount of heat added to each of the objects is periodically changed to thereby, equalize temperature throughout each of the objects.

When each of the resistive heating elements is a wire made of $MoSi_2$, their heat response becomes extremely more excellent to thereby make temperature raising speed about ten times that of the FeCrAl alloy wire heater and the non-uniformity of temperature on each matter surface larger. The method of the present invention can achieve extremely more remarkable effects when the temperature-raising speed is high like this.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a graph showing how results measured about temperature distribution on a wafer change as time goes by.

DETAILED DESCRIPTION O THE PREFERRED EMBODIMENTS

Some embodiments of the present invention will be described with reference to the accompanying drawings.

Figure 2:
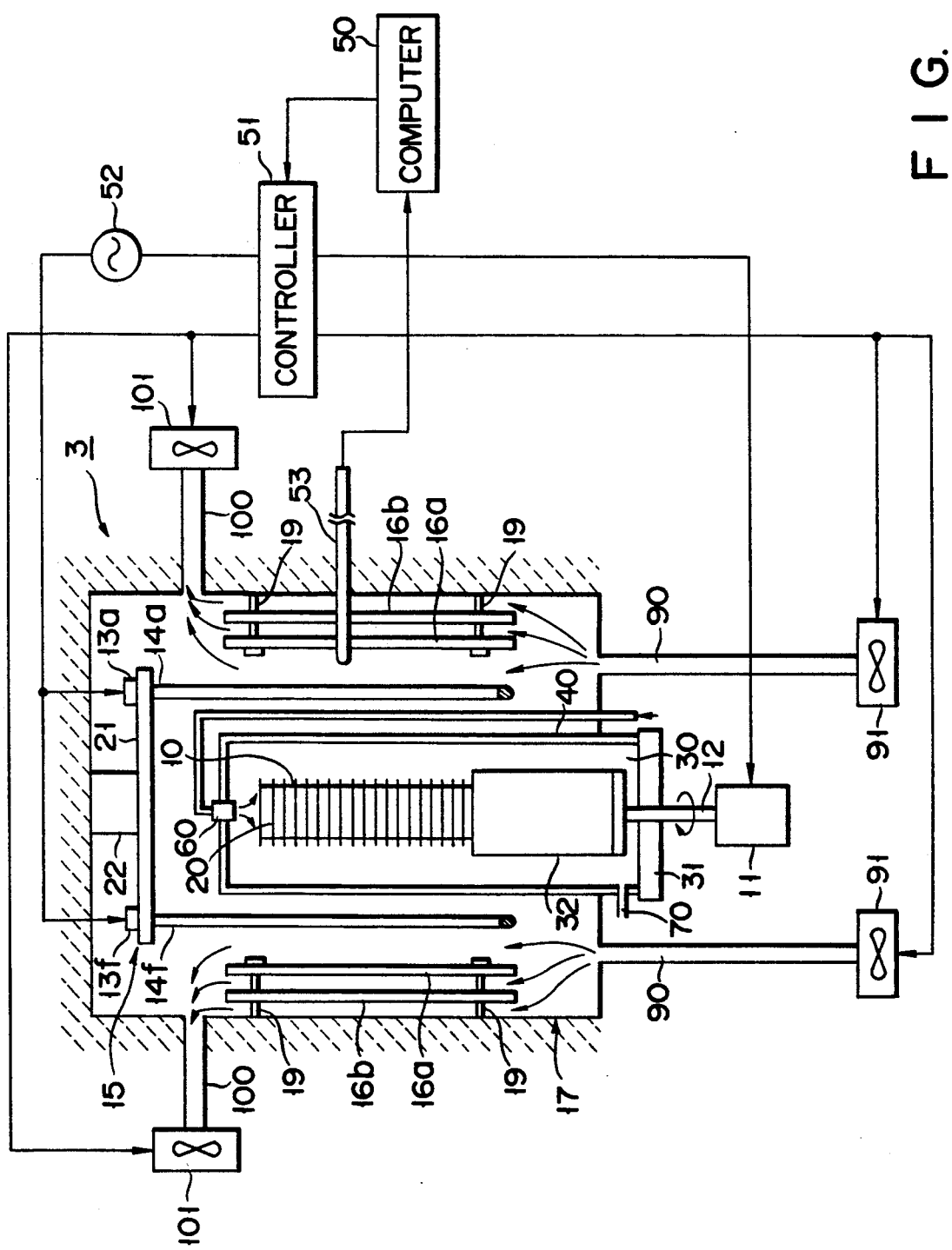
FIG. 2 is a block diagram showing the furnace in the heat-diffusing apparatus vertically sectioned, in which apparatus the heat-treating method according to an embodiment of the present invention is used.

As shown in FIG. 2, the heat-diffusing apparatus 3 has a furnace 17 for heat-diffusing and -treating a plurality of semiconductor wafers 20 therein at once. A process tube 40 is arranged in the furnace 17. The process tube 40 is provided at the top thereof with a gas supply opening 60 which is communicated with a gas supply unit (not shown). The gas supply unit has plural gas sources in which an oxygen gas, a halogen group gas or hydrogen group ga is contained.

On the other hand, the process tube 40 is provided at the lower end thereof with a gas exhaust opening 70 which is communicated with a gas exhaust unit (not shown). The gas exhaust unit has a suction pump which exhaust gas in the process tube 40.

Power supplies (not shown) of these gas source and exhaust units are connected to the output section of a PID controller 51 so that gas flow can be controlled to uniformly apply reaction gas onto each of the wafers 20 in the process tube 40. A computer 50 is connected to the input section of the controller 51, which is thus backed up by the computer 50.

A thermocouple 53 passes through the outer wall of the furnace 17, positioning its tip portion adjacent to the process tube 40. The thermocouple 53 is connected to the input section of the computer 50.

A wafers transferring chamber (not shown) is arranged under the furnace 17. As disclosed in U.S. Pat. No. 4,938,691, the wafers transferring chamber is provided with handler and elevator units (not shown). The wafers 20 are transferred from a cassette onto a boat 10 by the handler unit. While being mounted on a heat-insulating cylinder 32, the boat 10 is moved up and down by the elevator unit to come into and out of the process tube 40 through a bottom opening 30 of the process tube 40. A lid 31 is moved together with the boat 10 to close the bottom opening 30 of the process tube 40 when the boat 10 is loaded into the process tube 40.

Further, the boat 10 and the heat-insulating cylinder 32 are supported by a shaft 12 of a rotator unit 11. The operation of a motor (not shown) in the rotator unit 11 is controlled by the controller 51.

A heater unit 15 is attached to the ceiling of the furnace 17 by a member 22. A top plate 21 of the heater unit 15 is positioned just above the process tube 40 and ten heating elements 14a–14j attached to the top plate 21 so as to surround the process tube 40.

Figure 3:
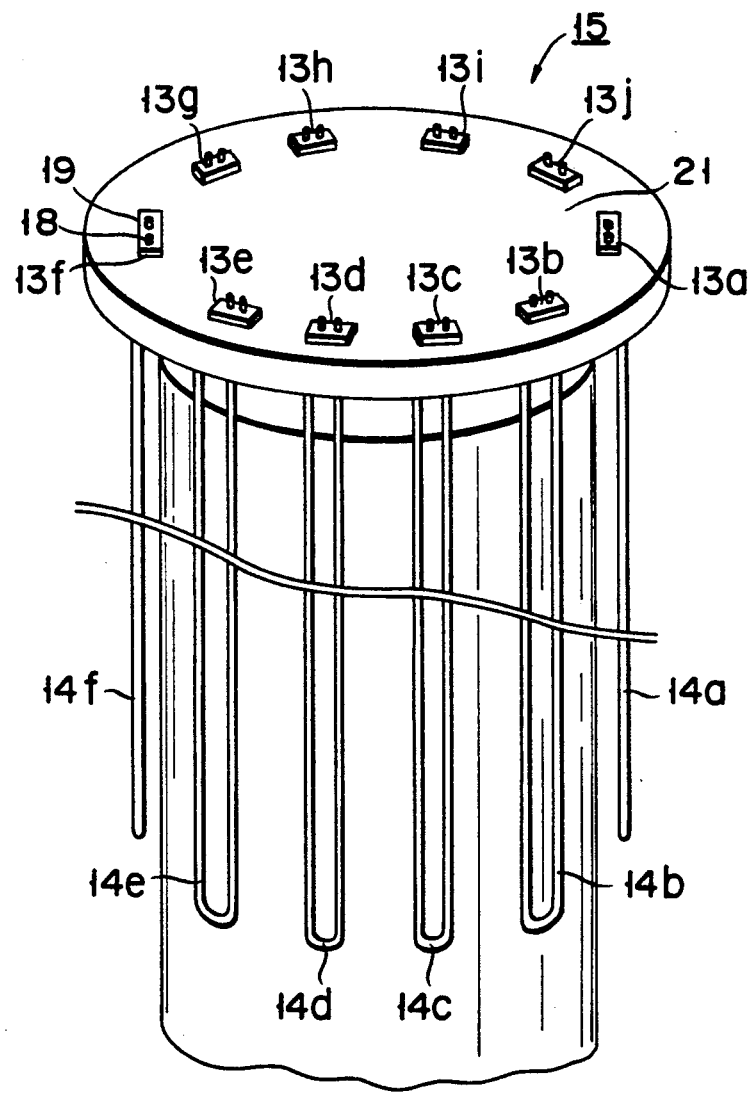
FIG. 3 is a perspective view showing a heater unit.

As shown in FIG. 3, both ends of the heaters 14a–14j are fixed to the top plate 21 along the outer rim thereof by terminals 13a–13j and each of the heaters 14a–14j is shaped like a letter U, extending downward from the top plate 21 and then returning to the top plate 21. Each of the terminals 13a–13j is connected to a power source 52.

It is most suitable that each of the heaters 14a–14j is a resistant heating wire made of molybdenum disilicide ($MoSi_2$). Although the maximum heat value of the conventional FeCrAl alloy wire is $2W/cm^2$, the $MoSi_2$ wire has a higher heat value of $20W/cm^2$ (about ten times)n to create a by far stronger power increase.

Further, the $MoSi_2$ heating element can raise the temperature at a speed of 100° C./min, whereas the FeCrAl heating element raises the temperature at a speed of only 10° C./min. Therefore, the heaters 14a to 14j can heat the process tube 40 to about 1000° C. within a short period of time.

When the heater element having so high a heat value is used in the form of a spiral, it is often broken. It is therefore preferable that each of the heaters 14a–14j is linearly hung from the top plate 21.

Each of the heaters 14a–14j has an average diameter of 4 mm and it is hung 600–1000 mm from the top plate 21.

Figure 4:
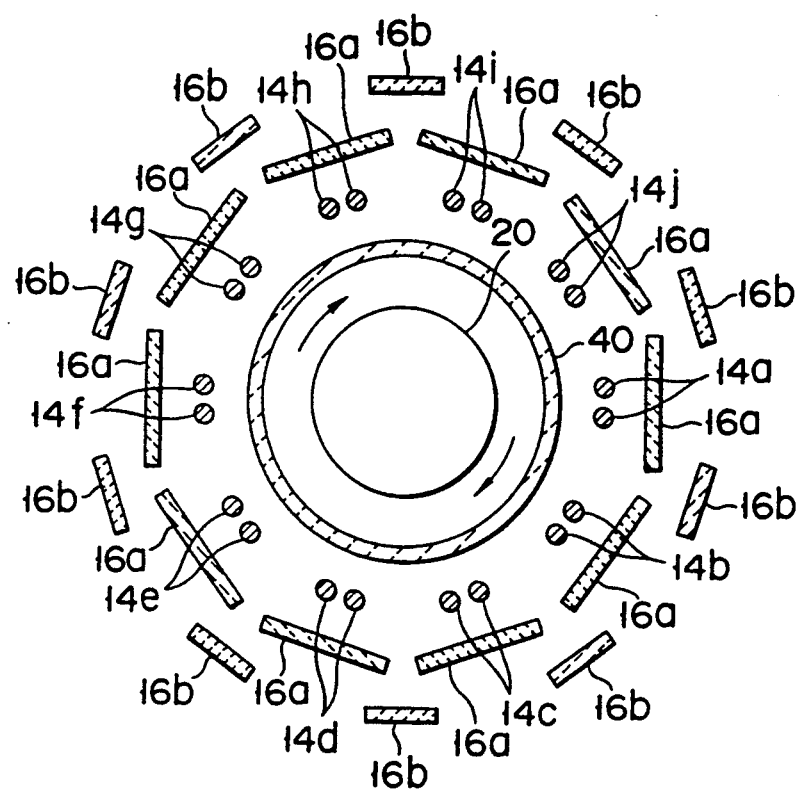
FIG. 4 is a layout view showing the heater unit vertically sectioned, said heater unit being arranged along the inner side of the furnace.

As shown in FIG. 4, the heaters 14a–14j are arranged round the process tube 40 at a same interval. Double reflector plates 16a and 16b are also arranged round the heaters 14a–14j. there are ten first reflectro plates 16a and ten second reflector plates 16b. The interval between the first reflector plate and its corresponding heater is substantially same as that between this heater and the process tube 40. Each of the second reflector plates 16b is positioned behind the space between its corresponding two first reflector plates 16a. The reflector plates 16a, 16b and the top plate 21 are made of ceramics such as $Al_2O_3$ and $Al_2O_3-SiO_2$.

As shown in FIG. 2, plural cooling gas supply passages 90 are formed in the floor of the furnace 17 and plural exhaust passages 100 are also formed in the upper portion of the side wall of the furnace 17. The output section of the controller 51 is connected to each of power sources of fans 91 and 101 in the cooling gas supply and exhaust passages 90 and 100. The cooling gas supply passages 90 are communicated with an air intake (not shown) and the exhaust passages with a waste-heat collector unit (not shown). Heat-insulating material may be coated thin on the inner wall of the furnace 17.

Figure 5:
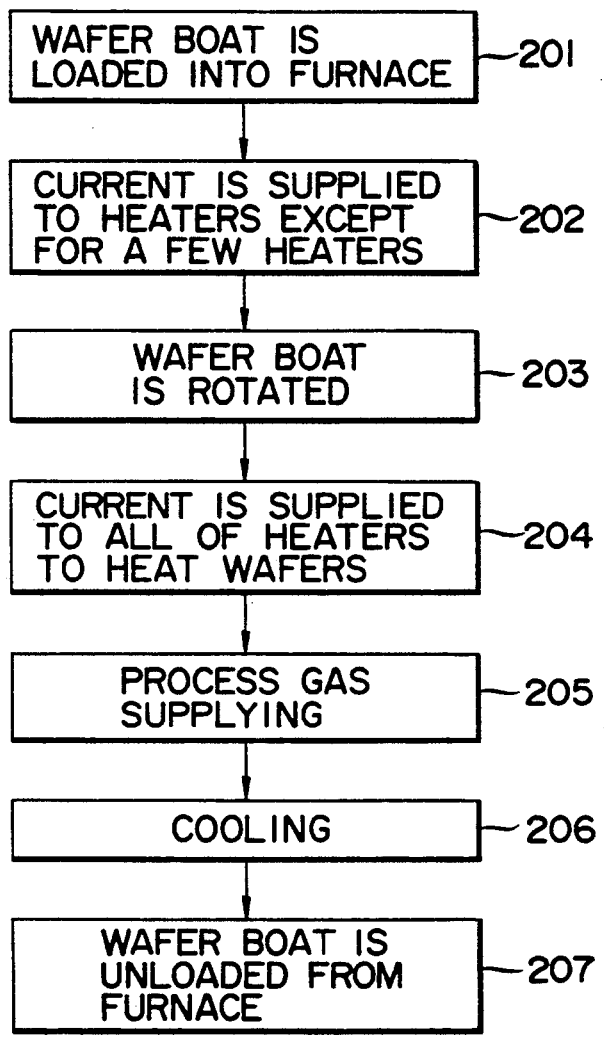
FIG. 5 is a flow chart intended to explain the case where wafers are heat-treated by the heat-treating method of the present invention.

It is explained that the wafers are processed for thermal oxygenation according to reference to FIG. 5.

The wafers 20 are taken out from their cassettes (not shown) at the cassette station and successively mounted on the boat 10. When thirty sheets of the wafers 20 are mounted on the boat 10, the boat 10 is loaded into the process tube 40 through the bottom opening 30 thereof by the elevator unit (step 201).

After the bottom opening 30 of the furnace 17 is closed by the lid 31, current is supplied to the eight heaters 14c to 14j except the heaters 14a and 14b to heat the wafers 20 in the process, tube 40 (step 202). Heat emitted from the resistive heating elements 14c-14j is reflected toward the process tube 40 by the reflector plates 16, so that the temperature of the process tube 40 can be raised rapidly.

Figure 6:
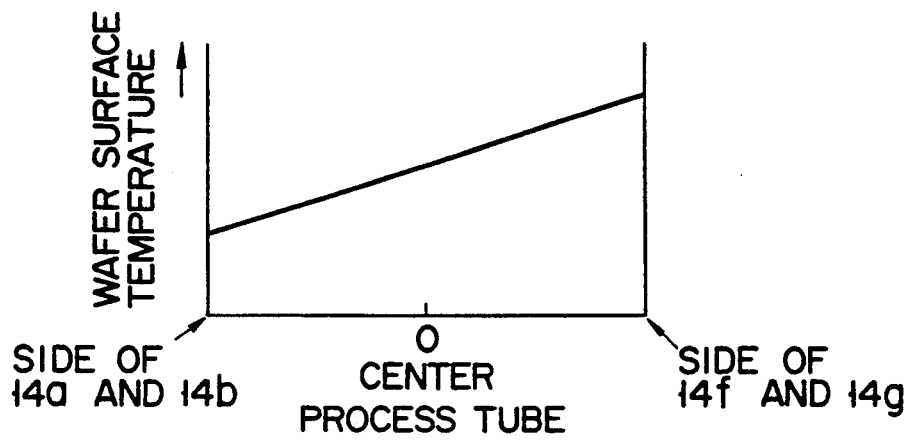
FIG. 6 is a graph showing temperature distribution in the process tube.

As is shown in FIG. 6, since the amount of thermal energy applied to one side (side of the heaters 14a, 14b) of the process tube 40 is smaller than that of thermal energy applied to other side (side of the heaters 14f, 14g) of the tube 40, each wafer 20 has a temperature gradient, from one side to the other.

The boat 10 is rotated (step 203) at a speed of about 10 rpm, substantially at the same time the heating is started. As a result, the high-temperature side and low-temperature side of each wafer 20 are switched, and amount of heat input applied to any limited part of the peripheral portion periodically changes as the boat 10 is rotated. The amount of heat input added to the peripheral portion of the wafer 20 is averaged thereby heated uniformly. In addition, the peripheral portion of the wafer 20 is heated to the same extent as the center portion of the wafer 20. In other words, the amount of heat input added to the peripheral portion of wafer 20 is balanced with that of center portion, and each wafer is heated uniformly in its entirely.

The time at which the boat 10 is rotated is preferably started after current supply to some of the heaters is stopped, but the boat 10 may be rotated before this current supply is stopped. Particularly when the rotation speed of the boat 10 is made low, no time limit is needed to the control of the amount of heat created by the heaters and the rotation start of the boat.

When the temperature in the furnace changes, becoming very similar to the process temperature, electric power is supplied to all heaters 14a to 14j, thereby heating each wafer 20 uniformly (step 204). The temperature of the wafers 20 is detected by means of a thermocouple 53, thereby to determine whether or not the wafer temperature has reached the process temperature.

After each of the wafers 20 is uniformly heated, nitrogen gas, used as process gas is supplied into the process tube 40 (step 205). The down flow of oxygen gas flowing from the gas supply opening 60 to the exhaust opening 70 is thus formed. The oxygen gas is uniformly applied onto each of the wafers 20, thereby oxide film is formed on the wafer.

The supply of process ga is stopped and nitrogen gas is supplied to fill the process tube 40. In addition, current supply to the other eight heaters 14c-14j is stopped and the rotation of the boat 10 is also stopped. Further, the furnace is exhausted while supplying cooling air into the furnace 17. The cooling air flows contacting the process tube 40, the heaters 14a-14j, the reflector plates 16a and 16b and the inner wall of the furnace 17. The process tube 40 is thus forcedly cooled and each of the wafers is also cooled to room temperature for a short time (step 206).

When each of the wafers 20 is cooled in this manner, the boat 10 is lowered by the elevator unit to carry the wafers 20 out of the furnace 17 (step 207). One cycle starting from the step 201 and ending with the step 207 takes about 30 minutes.

Figure 7:
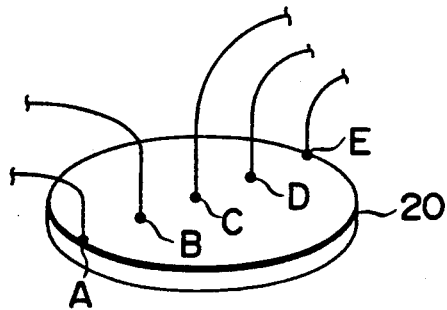
FIG. 7 is a perspective view showing how temperature distribution on a wafer is measured.

As shown in FIG. 7, five thermocouples were attached to a sample wafer 20, which was heated in the process tube 40 to examine how temperature changes at points A-E on the surface of the wafer 20. These points A-E were aligned at a same interval on a line extending from one side of the wafer 20 to the other thereof. The points A and E were located adjacent to the outer circumferential rim of the wafer 20, and the point C was in the center of the wafer 20. The above described temperature control at the time of uniform heating was carried out (in other words, current supply to the two heaters 14a and 14b was stopped and the wafer was rotated at the speed of 10 rpm) while keeping the normal temperature-raising speed at 100° C./minute.

Temperature control was performed in the way described above.

Figure 1:
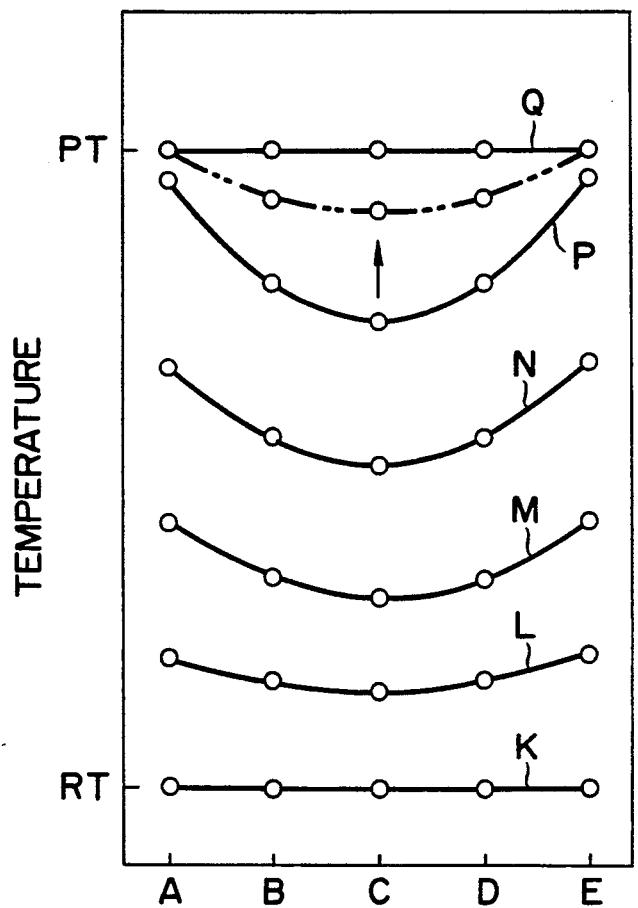
FIG. 1 is a graph showing temperature distribution in a surface of a semiconductor wafer heated by the conventional heat-treating method.
Figure 8:
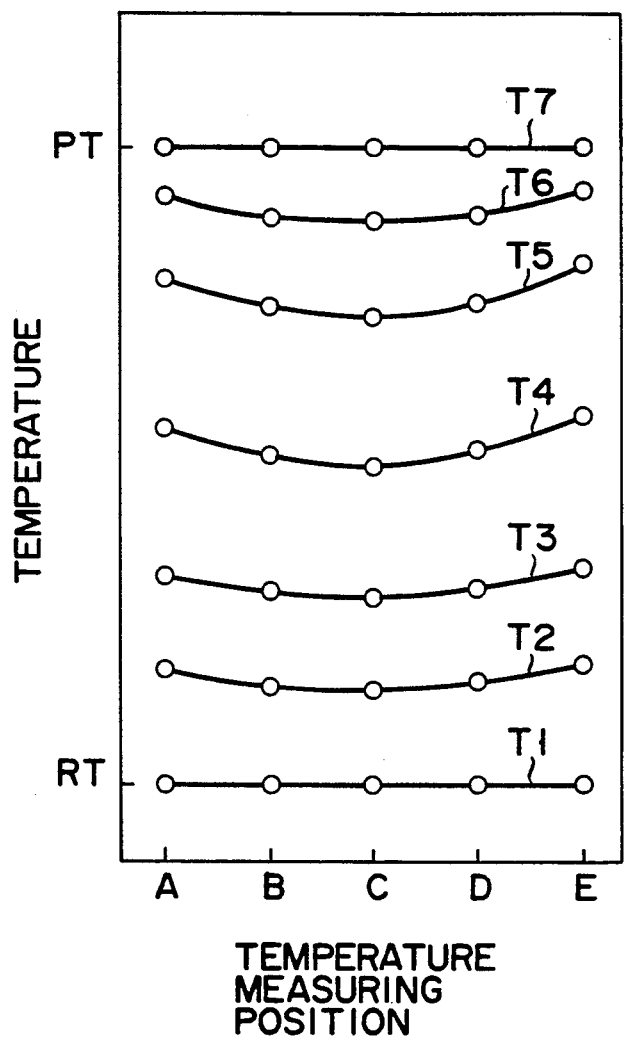

As is shown in FIG. 8, it was recorded how the temperature distribution in the wafer surface changed as the wafer 20 is heated from room temperature (line $T_1$) to the process temperature (line $T_7$). While the temperature in the furnace was increased gradually from heat beginning temperature (line $T_2$) to a predetermined temperature (line $T_6$) slightly lower than the process temperature, the temperature difference between the center portion of each wafer and the peripheral portion thereof was less than in the conventional case (FIG. 1). Thereafter, the temperature in the furnace was reached at the process temperature (line $T_7$), whereby said temperature difference of the wafer surface decreased to nil.

Although the case where current supply to the heaters 14a and 14b is stopped has been described in the above-mentioned embodiment, the present invention is not limited to this case but the amount of current supplied to some of the heaters 14a-14j may be reduced. It may be arranged in this case that the heaters are divided into some zones or three zones, for example, and that the amount of current supplied to each of these zones is adjusted to control temperature differences at these zones in the process tube (or temperature reduction at the lower portion of the process tube).

Further, heaters may be added above and under the process tube.

Furthermore, the shaft of the wafer boat may be made eccentric to the shaft of the process tube.

In the embodiment described above, the wafers are subjected to thermal oxidation. Nonetheless, according to the invention, the present invention can be applied to from the forming of a film by means of CVD or to the thermal diffusion of impurity.

According to the heat-treating method of the present invention, the wafers are rotated while heating the outer circumference of the process tube so different in temperature as to cause temperature gradient on the surface and in the diameter direction of each of the wafers in the process tube. The temperature gradient in the diameter direction of each of the wafers can be thus balanced and the wafers can be uniformly heated accordingly.

This is efficient particularly when the wafers are to be quickly heated and semiconductor device products thus provided can have uniform quality.

Further, the wafers can be heated to the same extent. In other words, the wafers are not heated to different temperatures.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A vertical process tube heating method utilizing heating element control to achieve a temperature gradient, comprising the steps of:
providing a plurality of resistive heating elements along the longitudinal direction of a vertically disposed, elongated process tube so as to be located around said process tube;
loading a plurality of substrates in said process tube in such a way that a plurality of substrates are parallel to one another, while keeping substrates are parallel to one another, while keeping substrate surfaces to be processed substantially horizontal;
supplying an initial current to resistive heating elements other than at least one thereof, to create a high temperature side and a low temperature side in said process tube along a direction parallel to the substrate surfaces such that each substrate has a temperature gradient along the surface of said substrate, thereby causing a temperature gradient between various peripheral portions of said process tube; and
rotating said plurality of substrates around an axis of said process tube so that entire regions of said substrates are heated at substantially a uniform rate of temperature elevation.

2. The method according to claim 1, further comprising arranging reflecting mean around said resistive heating elements, said reflecting means serving to reflect heat radiated from the resistive heating elements, and directing heat rays reflected by the heat reflector means to the process tube.

3. The method according to claim 1, wherein resistive heating elements to which said initial current is not supplies are actuated when the temperature of the substrates approaches a predetermined process temperatures to then uniformly heat said substrates from all sides.

4. The method according to claim 1, wherein the substrates are rotated while said initial current is supplied to other than at least one of the resistive heating elements.

5. The method according to claim 1, further comprising providing a temperature detector means to control the amount of current supplies to the resistive heating elements responsive to the temperature detected at a position adjacent to the process tube.

6. The method according to claim 1, further comprising providing a cooling air supply means outside of the process tube to cool the process tube and the resistive heating elements.

7. The method according to claim 1, wherein each of the resistive heating elements is a wide made of $MoSi_2$.

8. The method according to claim 1, wherein current amounts supplies to said resistive heating elements are individually controlled.

9. A vertical process tube heating method utilizing heating element control to achieve a temperature gradient, comprising the steps of:
providing a plurality of resistive heating elements along the longitudinal direction of a vertically disposed elongated process tube so as to be placed around said process tube;
controlling the amount of current supplied to each of the resistive heating elements, to create a high temperature side and a low temperature side in said process tube, thereby casing a temperature gradient between various peripheral portions of said process tube; and
loading a plurality of substrates in said process tube in such a way that a plurality of substrates are parallel to one another, while keeping substrate surfaces to be processed substantially horizontal and while rotating said plurality of substrates in a condition wherein substrate surfces to be processed are substantially horizontal so that entire regions of said substrates are heated at substantially a uniform rate of temperature elevation;
wherein said controlling step creates said high temperature side and said low temperature side n said process tube along a direction parallel to the substrate surfaces hub that each substrate has a temperature gradient along the surface of the substrate.

10. The method according to claim 9, wherein current amounts supplied to said resistive heating elements are individually controlled.

11. The method according to claim 9, further comprising arranging reflecting means around said resistive heating elements, said reflecting means serving to reflect heat radiated form the resistive heating elements, and directing heat rays reflected by the heat reflector means to the process tube.

12. The method according to claim 9, wherein resistive heating elements to which said initial current is not supplies are actuated when the temperature of the substrates approaches a predetermined process temperature to then uniformly heat said substrates from all sides.

13. The method according to claim 9 wherein the substrates are rotated while said initial current is supplies to other than at least one of the resistive heating elements.

14. The method according t claim 9, further comprising providing a temperature detector means to control the amount of current supplied to the resistive heating elements responsive to the temperature detected at a position adjacent to the process tube.

15. The method according to claim 9, further comprising providing a cooling air supply means outside of the process tube to cool the process tube and the resistive heating elements.

16. The method according to claim 9, wherein each of the resistive heating elements s a wire made of $MoSi_2$.

* * * * *